(12) United States Patent
Ahmad et al.

(10) Patent No.: US 8,952,523 B2
(45) Date of Patent: Feb. 10, 2015

(54) INTEGRATED CIRCUIT PACKAGE LID CONFIGURED FOR PACKAGE COPLANARITY

(75) Inventors: Mudasir Ahmad, San Jose, CA (US);
Mohan R. Nagar, Cupertino, CA (US);
Weidong Xie, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 600 days.

(21) Appl. No.: 12/891,088

(22) Filed: Sep. 27, 2010

(65) Prior Publication Data
US 2012/0074557 A1  Mar. 29, 2012

(51) Int. Cl.
*H01L 23/12* (2006.01)
*H01L 23/367* (2006.01)
*H01L 23/498* (2006.01)

(52) U.S. Cl.
CPC ....... *H01L 23/3675* (2013.01); *H01L 23/49816* (2013.01); *H01L 2924/15311* (2013.01)
USPC .... 257/704; 257/693; 257/706; 257/E23.102; 257/E23.106; 257/E23.124; 361/709; 361/710; 361/711; 428/106; 428/122

(58) Field of Classification Search
USPC .......... 257/693, 704, 706, E23.102, E23.104, 257/E23.124; 438/106, 122; 361/709–711
See application file for complete search history.

(56) References Cited

U.S. PATENT DOCUMENTS

| 6,376,907 | B1 * | 4/2002 | Takano et al. ................ 257/704 |
| 7,303,941 | B1 | 12/2007 | Hubbard et al. |
| 2003/0107124 | A1 * | 6/2003 | Huang ........................... 257/706 |
| 2005/0104201 | A1 * | 5/2005 | Yang ............................. 257/720 |
| 2005/0139974 | A1 * | 6/2005 | Huang et al. ................ 257/678 |
| 2007/0205791 | A1 | 9/2007 | Ahmad et al. |

* cited by examiner

*Primary Examiner* — Meiya Li
(74) *Attorney, Agent, or Firm* — Edell, Shapiro & Finnan, LLC

(57) ABSTRACT

An integrated circuit package apparatus includes a packaging substrate, an integrated circuit coupled to an upper side of the packaging substrate, an array of contacts coupled to an underside of the packaging substrate for electrically coupling the integrated circuit to a circuit board, and a lid coupled to the upper side of the packaging substrate. In one form, the lid includes a central portion lying on a first plane, corner areas lying on a second plane, and arcuate wall portions disposed between and interconnecting the corner areas and the central portion. Other forms of the lid are provided.

14 Claims, 4 Drawing Sheets

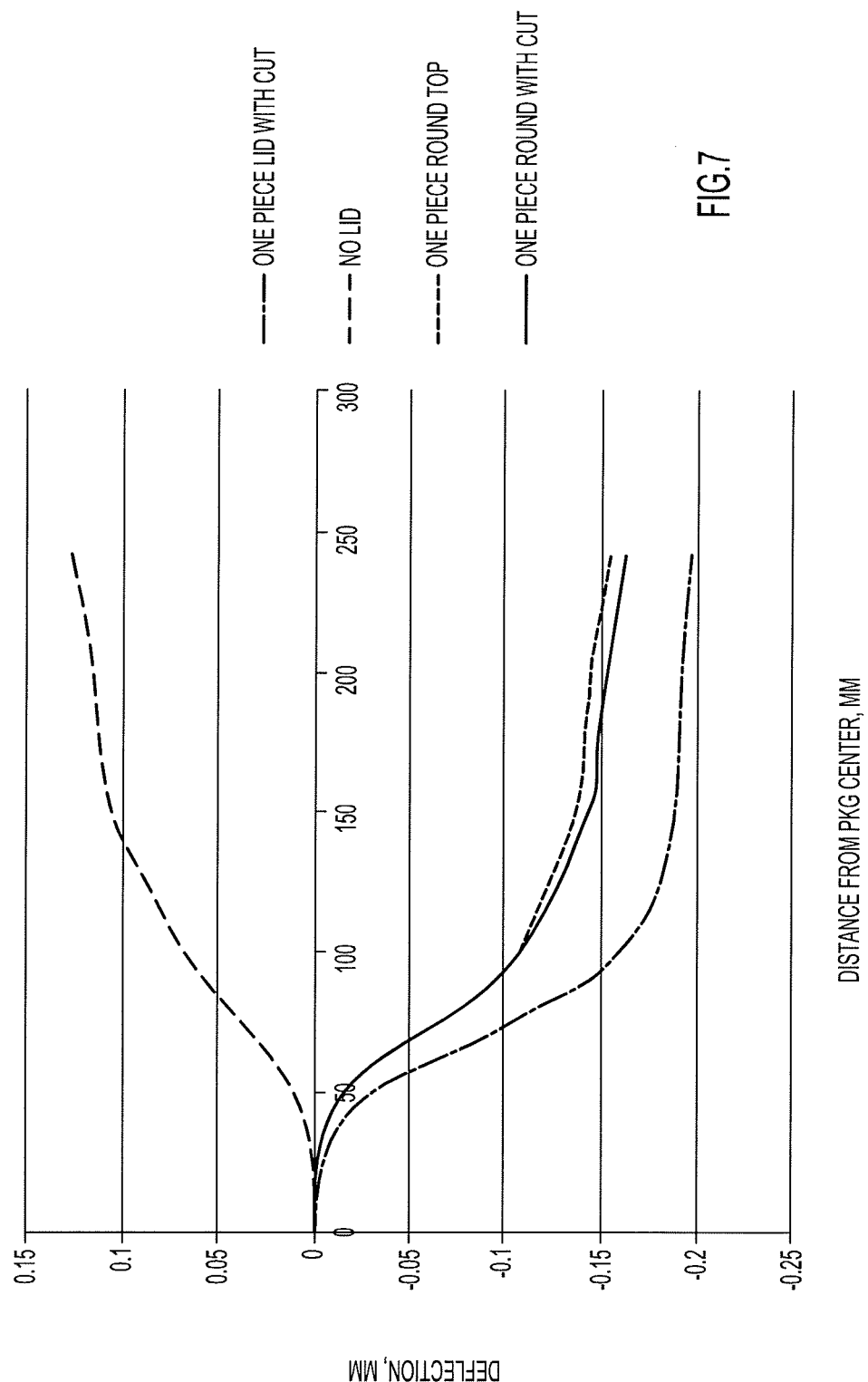

INTEGRATED CIRCUIT PACKAGE LID CONFIGURED FOR PACKAGE COPLANARITY

TECHNICAL FIELD

The present disclosure relates generally to a lid for an integrated circuit package.

BACKGROUND

In a typical ball grid array (BGA) package, an organic substrate is connected to a semiconductor die via an array of solder bumps and an underfill material. The substrate itself may have an array of solder balls to enable subsequent assembly of the package onto a printed circuit board (PCB). A lid may be adhered to the semiconductor die via a thermal interface material. However, excessive warpage of such BGA packages, particularly at the corner locations of the package, will significantly reduce the assembly yield and affect the reliability performance or cause early failure during package qualification testing.

BRIEF DESCRIPTION OF THE DRAWINGS

FIG. 7 illustrates a line graph showing package warpage finite element analysis for various package configurations.

DESCRIPTION OF EXAMPLE EMBODIMENTS

Overview

An integrated circuit package apparatus is provided that includes a packaging substrate having an upper side and an opposing underside. An integrated circuit is coupled to the upper side of the packaging substrate. An array of contacts is coupled to the underside of the packaging substrate for electrically coupling the integrated circuit to a circuit board. A lid is coupled to the upper side of the packaging substrate. The lid includes a central portion lying on a first plane, corner areas lying on a second plane, and arcuate wall portions. The arcuate wall portions are disposed between and interconnect the corner areas and the central portion.

Example Embodiments

Figure 1:
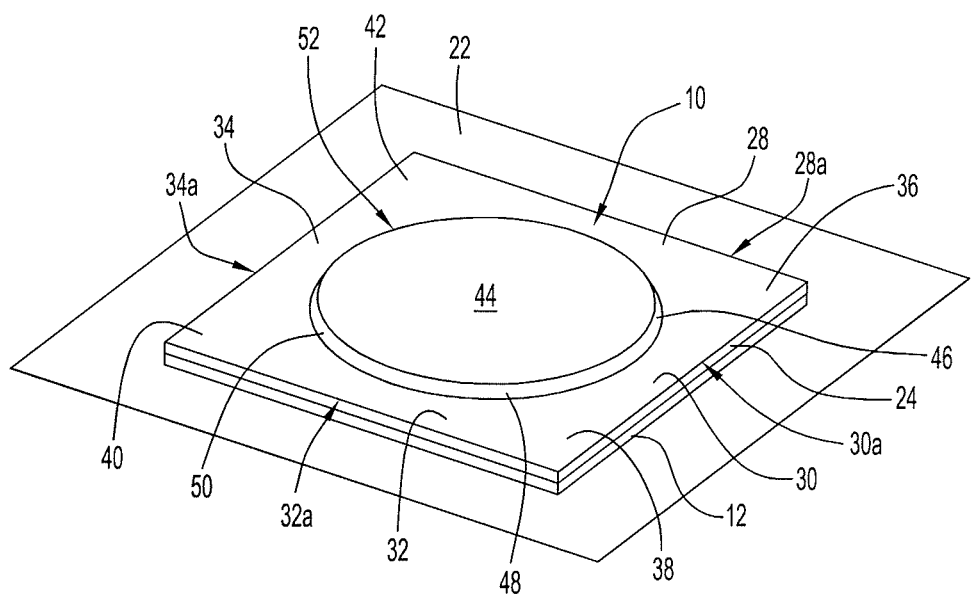
FIG. 1 illustrates a perspective view of an example of an integrated circuit package.
Figure 2:
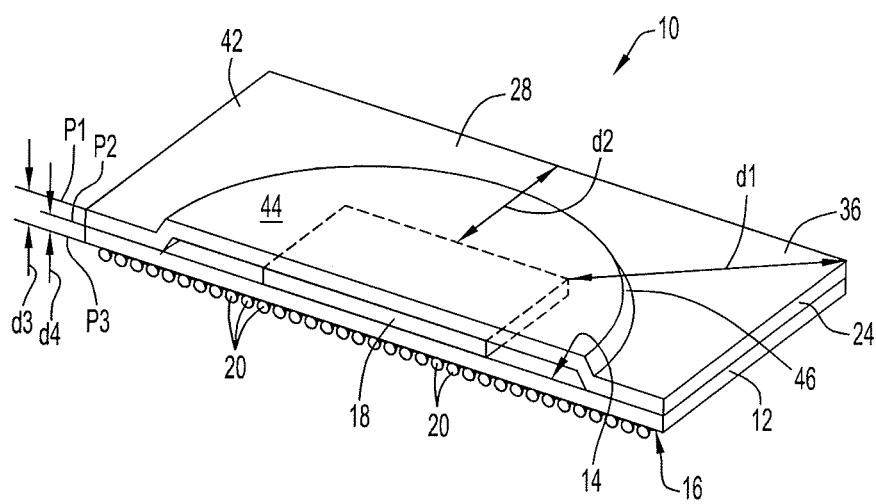
FIG. 2 illustrates a sectional perspective view of the integrated circuit package of FIG. 1.

A first example of an integrated circuit package 10 is illustrated in FIGS. 1 and 2. Package 10 includes a packaging substrate 12 including an upper side 14 and an opposing underside 16. An integrated circuit 18 is attached or mounted to the upper side 14 of the packaging substrate 12. An array of contacts, such as a ball grid array (BGA) 20, is provided on the underside 16 of the packaging substrate 12 for electrically coupling the integrated circuit 18 to a circuit board 22.

A lid 24 is coupled to the upper side 14 of the packaging substrate 12. The lid 24 may be formed from a copper alloy. The lid 24 may be adhered to the packaging substrate 12 using a thermally-conductive polymer adhesive.

The lid 24 includes first, second, third and fourth side portions 28, 30, 32, 34, which include first, second, third and fourth outer edges 28a, 30a, 32a, 34a, respectively. The periphery of the lid 24, defined by first, second, third and fourth outer edges 28a, 30a, 32a, 34a, may have a generally square or rectangular configuration in plan view. First, second, third and fourth corner areas 36, 38, 40, 42 are defined by adjacent or interfacing areas of first, second, third and fourth side portions 28, 30, 32, 34. Accordingly, the first, second, third and fourth corner areas 36, 38, 40, 42 are substantially coplanar with the first, second, third and fourth side portions 28, 30, 32, 34.

The lid 24 further includes a central portion 44 lying on a first plane P1 spaced from a second plane P2 on which the first, second, third and fourth corner areas 36, 38, 40, 42 lie. First, second, third and fourth arcuate wall portions 46, 48, 50, 52 are disposed between and interconnect the central portion 44 and the first, second, third and fourth corner areas 36, 38, 40, 42, respectively. For example, the first, second, third and fourth arcuate wall portions 46, 48, 50, 52 may be formed via stamping or depressing a planar lid blank to form the first, second, third and fourth corner areas 36, 38, 40, 42.

The first, second, third and fourth arcuate wall portions 46, 48, 50, 52 may collectively have a substantially circular configuration or shape in plan view. Alternatively, wall portions including one or more linear sections may be provided. Further, wall portions may be either directly connected to and continuous with each other, or alternatively spaced from each other. In addition to the circular configuration illustrated, wall portions collectively having other geometric arrangements may be provided (e.g. oval, square, diamond shaped, etc.).

The first, second, third and fourth arcuate wall portions 46, 48, 50, 52 are preferably disposed at an angle of between about 30° and about 45° relative to the first plane P1 on which the central portion 44 lies and/or relative to the second plane P2 on which the first, second, third and fourth corner areas 36, 38, 40, 42 lie.

The resulting chamfered configuration of the first, second, third and fourth arcuate wall portions 46, 48, 50, 52 minimizes internal stresses on the lid during formation, such as if the lid is formed via a stamping or bending process. Further, the rounded shape of the first, second, third and fourth arcuate wall portions 46, 48, 50, 52 uniformly distributes stresses (e.g. such as from deflection) throughout the lid 24.

In addition, the rounded shape of the first, second, third and fourth arcuate wall portions 46, 48, 50, 52 increases the overall footprint or surface area of the first, second, third and fourth corner areas 36, 38, 40, 42, thereby increasing the contact or interface area between the lid 24 and the upper side 14 of the packaging substrate 12. As shown in FIG. 2, a first distance d1 between the integrated circuit 18 and distal points of the first, second, third and fourth corner areas 36, 38, 40, 42 is greater than a second distance d2 between the integrated circuit 18 and the first, second, third and fourth side portions 28, 30, 32, 34. Thus, additional surface area for adhering or coupling the lid 24 to the packaging substrate 12 may be provided. The surface area or footprint of the first, second, third and fourth corner areas 36, 38, 40, 42 may be adjusted by increasing or decreasing the first distance d1 between the integrated circuit 18 and the first, second, third and fourth corner areas 36, 38, 40, 42.

The upper side 14 of the packaging substrate 12 lies on a third plane P3. The third plane P3 is spaced from the first plane P1 by a third distance d3. The third plane P3 is spaced from the second plane P2 by a fourth distance d4 less than the third distance d3. One or more of the first second, third and fourth side portions 28, 30, 32, 34 may be coupled to the packaging substrate 12, such as via an adhesive, while the central portion 44 is spaced from the packaging substrate 12 in order to accommodate the integrated circuit 18.

The lid 24 has a substantially uniform thickness or caliper. Accordingly, the caliper of the central portion 44 is substantially equal to the caliper of the first, second, third and fourth side portions 28, 30, 32, 34 and first, second, third and fourth corner areas 36, 38, 40, 42.

Figure 3:
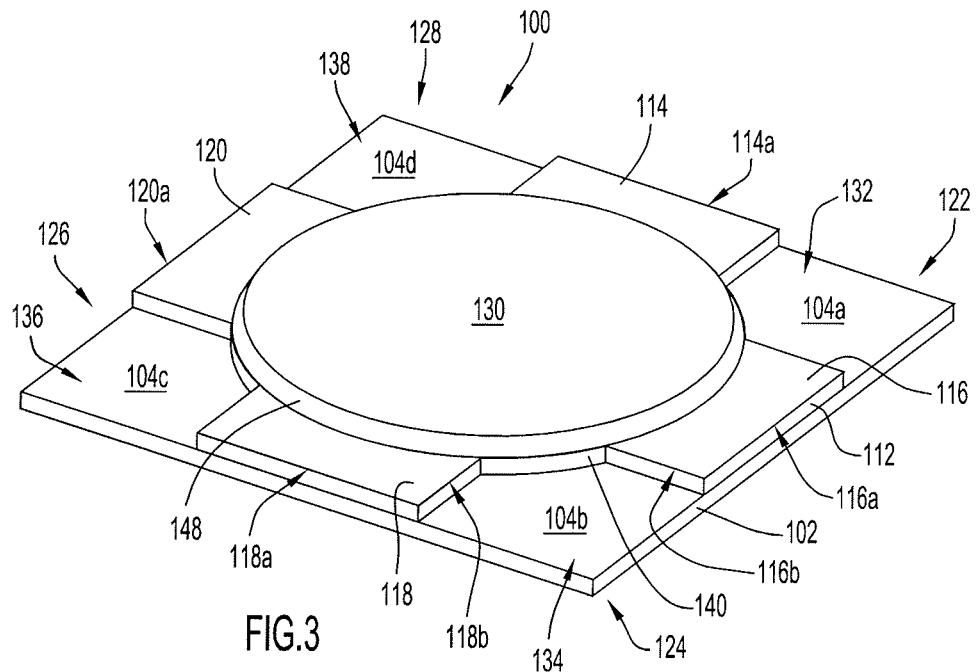
FIG. 3 illustrates a perspective view of another example of an integrated circuit package.
Figure 4:
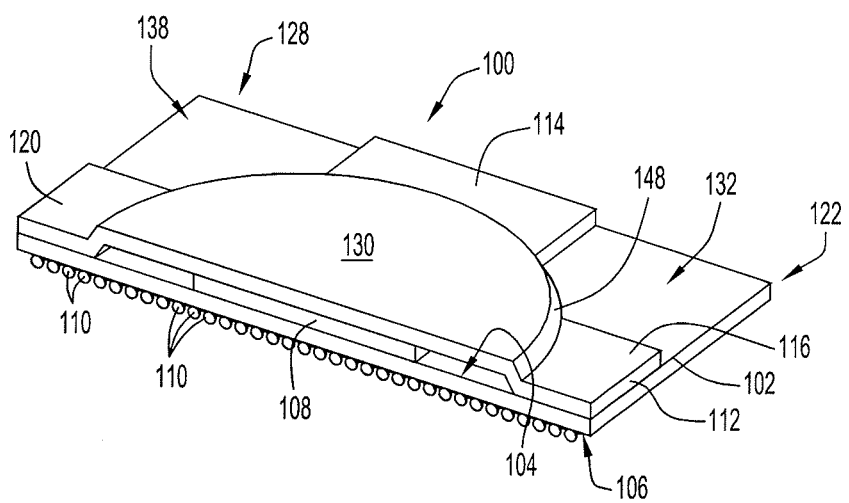
FIG. 4 illustrates a sectional perspective view of the integrated circuit package of FIG. 3.

Another example of an integrated circuit package 100 is illustrated in FIGS. 3 and 4. Package 100 includes a packaging substrate 102 including an upper side 104 and an opposing underside 106. An integrated circuit 108 is coupled to the upper side 104 of the packaging substrate 102. An array of contacts, such as a ball grid array 110, is coupled to the underside 106 of the packaging substrate 102 for electrically coupling the integrated circuit 108 to a circuit board (e.g. circuit board 22 as shown in FIG. 1).

A lid 112 is coupled to the upper side 104 of the packaging substrate 102. The lid 112 includes first, second, third and fourth side portions 114, 116, 118, 120, which include first, second, third and fourth outer edges 114a, 116a, 118a, 120a, respectively. The periphery of the lid 112 may have a generally square or rectangular configuration in plan view. One or more of the first, second, third and fourth side portions 114, 116, 118, 120 are coupled to the upper side 104 of the packaging substrate 102.

First, second, third and fourth corner areas 122, 124, 126, 128 are defined by adjacent or interfacing areas of the first, second, third and fourth side portions 114, 116, 118, 120, respectively. The lid 112 may also include a central portion 130 lying on a plane spaced from the plane on which the first, second, third and fourth side portions 114, 116, 118, 120 lie. Corner area 122 includes or defines an opening or gap 132 exposing a correspondingly aligned portion 104a of the upper side 104 of the packaging substrate 102.

Similarly, the second, third and fourth corner areas 124, 126, 128 include or define second, third and fourth openings or gaps 134, 136, 138, respectively. For example, a portion or all of each of the first, second, third and fourth corner areas 122, 124, 126, 128 may be removed to form or define the first, second, third and fourth gaps 132, 134, 136, 138. Second, third and fourth gaps 134, 136, 138 expose correspondingly second, third and fourth aligned portions 104b, 104c, 104d of the upper side 104 of the packaging substrate 102, respectively. Because deflection or warpage is prevalent in the corner areas of a lid, the removal of portions of the first, second, third and fourth corner areas 122, 124, 126, 128 eliminates or minimizes the possibility of such deformation.

The first, second, third and fourth side portions 114, 116, 118, 120 of the lid 112 may be adhered or coupled to the upper surface 104 of the packaging substrate 102, while all or a majority of the first, second, third and fourth corner areas 122, 124, 126, 128 remain exposed and decoupled from the packaging substrate 102 due to first, second, third and fourth gaps 132, 134, 136, 138.

The second corner area 124 may include an arcuate edge 140 proximate to or partially defining the second gap 134. The second gap 134 is further defined by an end 116b of the second side portion 116 and an end 118b of the third side portion 118. The first, third and fourth corner areas 122, 126, 128 may be similarly configured, including arcuate edges (similar to arcuate edge 140), and adjacent ends or corresponding first, third and fourth side portions 118, 120, 114.

As noted above, the central portion 130 lies on a plane spaced from the plane on which the first, second, third and fourth side portions 114, 116, 118, 120 lie. A wall portion 148 is disposed between and interconnects the central portion 130 and the first, second, third and fourth side portions 114, 116, 118, 120. The wall portion 148 may have a curved or substantially circularly configuration in plan view. Alternatively, wall portions including one or more linear sections may be provided. Further, wall portions may be either directly connected and continuous with each other, or alternatively spaced from each other. In addition to the circular configuration illustrated, wall portions collectively having other geometric arrangements may be provided (e.g. oval, square, diamond shaped, etc.).

Accordingly the wall portion 148 may interface with or be proximate to the arcuate edges 140 partially defining the first, second, third and fourth gaps 132, 134, 136, 138. The wall portion 148 is preferably disposed at an angle of between about 30° and about 45° relative to the plane on which the central portion 130 lies and/or relative to the plane on which the first, second, third and fourth side portions 114, 116, 118, 120 lie.

By increasing or decreasing the size of the first, second, third and fourth gaps 132, 134, 136, 138 (and thus the surface area or footprint of the first, second, third and fourth portions 104a, 104b, 104c, 104d of the packaging substrate 102), the surface area or footprint of the lid 112 relative to the packaging substrate 102 may be adjusted.

Figure 5:
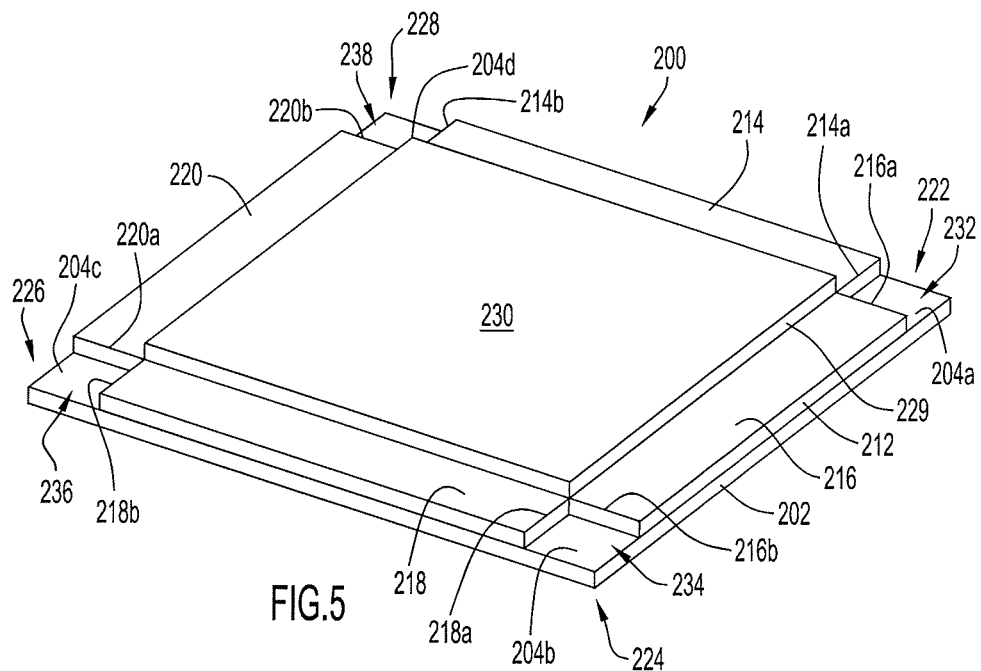
FIG. 5 illustrates a perspective view of another example of an integrated circuit package.
Figure 6:
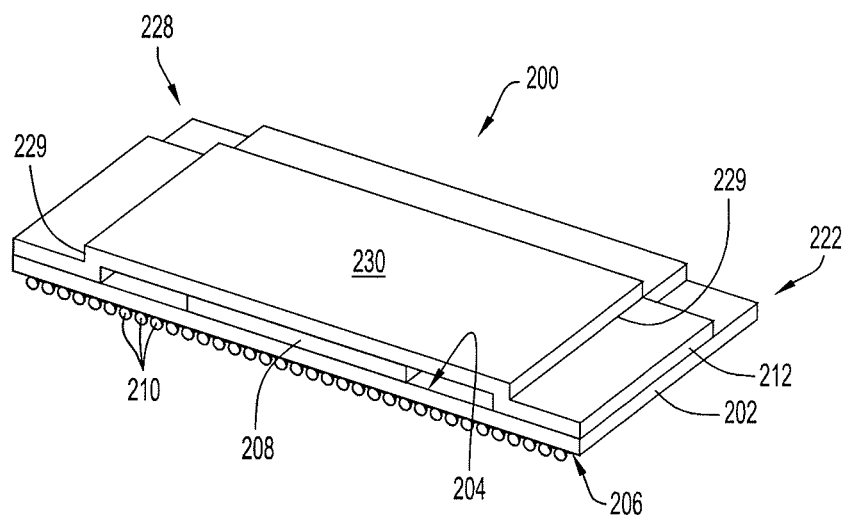
FIG. 6 illustrates a sectional perspective view of the integrated circuit package of FIG. 5.

Another example of an integrated circuit package 200 is illustrated in FIGS. 5 and 6. Package 200 includes a packaging substrate 202 including an upper side 204 and an opposing underside 206. An integrated circuit 208 is coupled to the upper side 204 of the packaging substrate 202. An array of contacts, such as a ball grid array 210, is coupled to the underside 206 of the packaging substrate 202 for electrically coupling the integrated circuit 208 to a circuit board (such as circuit board 22 as shown in FIG. 1).

A lid 212 is coupled to the upper side 204 of the packaging substrate 202. Similar to lid 112, lid 212 includes first, second, third and fourth side portions 214, 216, 218, 220. The periphery of the lid 212 has a generally square or rectangular configuration in plan view. One or more of the first, second, third and fourth side portions 214, 216, 218, 220 are coupled to the upper side 204 of the packaging substrate 202.

First, second, third and fourth corner areas 222, 224, 226, 228 are defined by adjacent ends of first, second, third and fourth side portions 214, 216, 218, 220. The lid 212 may also include a central portion 230 lying on a plane spaced from the plane on which the first, second, third and fourth side portions 214, 216, 218, 220 lie. A wall portion 229 is disposed between and interconnects the central portion 230 and the first, second, third and fourth side portions 214, 216, 218, 220.

First corner area 222 includes or defines a first opening or gap 232 exposing a correspondingly first aligned portion 204a of the upper side 204 of the packaging substrate 202. Similarly, second, third and fourth corner areas 224, 226, 228 include or define second, third and fourth openings or gaps 234, 236, 238, respectively. Second, third and fourth gaps 234, 236, 238 expose correspondingly second, third and fourth aligned portions 204b, 204c, 204d of the upper side 204 of the packaging substrate 202, respectively. Each of the first, second, third and fourth portions 204a, 204b, 204c, 204d may have a generally square or rectangular configuration in plan view.

The first gap 232 of the first corner area 222 is defined by an end 214a of the first side portion 214 and an end 216a of the second side portion 216. The second gap 234 of the second corner area 224 is defined by another end 216b of the second side portion 216 and an end 218a of the third side portion 218. The third gap 236 of the third corner area 226 is defined by another end 218b of the third side portion 218 and an end 220a of the fourth side portion 220. The fourth gap 238 of the fourth corner area 228 is defined by another end 220b of the fourth side portion 220 and another end 214b of the first side portion 214.

Deflection (e.g. warpage) is prevalent in the corner areas of a lid. As such, removal of some or all of the lid material in the first, second, third and fourth corner areas 222, 224, 226, 228 eliminates or minimizes the possibility of such deflection. The first, second, third and fourth portions 204a, 204b, 204c, 204d of the packaging substrate 202 are exposed and decoupled from the lid 112.

FIGS. 1-6 show examples of flip-chip BGA packages having lid structures configured to minimize warpage at the corner areas of the packages. Performance of an integrated circuit package, such as a flip-chip BGA package, may be affected if the difference between the elastic modulus of the packaging substrate and of the lid is significantly different. Further, performance of the BGA package may be adversely affected if the difference between the coefficients of thermal expansions of the packaging substrate and the lid is significantly different. With different coefficients of thermal expansion, differential expansion and contraction of the components during thermal cycling may cause excessive deflection and/or failure. Such deflection is particularly prevalent at the corner areas of a package.

The coplanarity of a package may be optimized, and the effects of package deformation or warpage reduced, by modifying the corner areas of the lid. Coplanarity of the package is ideally optimized at room temperature (e.g. 25° C.), as well as at peak reflow temperature (e.g. 220° C.), in order to ensure that functional testing may be performed on the package before coupling to a circuit board. Peak reflow temperature warpage is thus ideally minimized to ensure that during reflow, the solder joints of the package are not degraded and/or fail. However, eliminating warpage completely may result in internal stresses, which may likewise adversely affect performance.

The packaging substrate is formed from a material having a particular and determinable modulus and a particular coefficient of thermal expansion. Similarly, the lid is formed from a material having a particular and determinable modulus and a particular coefficient of thermal expansion.

The lid serves to protect the integrated circuit, enhance heat transfer from the integrated circuit to a heat sink, and provide stiffness and rigidity to the BGA package. The corner areas of the lid may be modified in order to provide a maximum and/or acceptable level of coplanarity of the package for optimum testing and circuit board assembly. The disclosed examples achieve such optimization, but do not impact or alter circuit board assembly.

Referring to FIG. 7, finite element analysis modeling was performed for: 1) a package without a lid (identified in FIG. 7 as "NO LID"); 2) a package having a lid similarly configured to the lid 24 illustrated in FIG. 1 (identified in FIG. 7 as "ONE PIECE ROUND TOP"); 3) a package having a lid similarly configured to the lid 112 illustrated in FIG. 3 (identified in FIG. 7 as "ONE PIECE ROUND WITH CUT"); and 4) a package having a lid similarly configured to the lid 212 illustrated in FIG. 5 (identified in FIG. 7 as "ONE PIECE LID WITH CUT"). The packaging substrate properties and the lid properties remained consistent for all models. Accordingly, the difference in lid configuration may be analyzed.

The results of the finite element analysis are illustrated graphically in FIG. 7. As shown therein, the deflection increases as the distance from the package center increases. However, the deflection of the lid may be controlled by altering its configuration. For example, the deflection of the lid 212 was about 8 mils (−0.2 mm), while the deflection of lid 24 was about 6 mils (−0.15 mm) and the deflection of the lid 112 was about 6.4 mils (−0.16 mm).

The deflection of the example package without a lid was about 5.2 mils (0.13 mm), as shown in FIG. 7. Accordingly, a lid having the configuration of lid 24 (exhibiting a deflection of about −0.15 mm) or of lid 112 (exhibit a deflection of about −0.16 mm) would be appropriate. With all other factors and properties substantially equal, the deflection of lids 24, 112 indicates an overall improvement of coplanarity of about 25% as compared to the deflection of lid 212. The deflection of the resulting package would be minimal, given the deflection of the packaging substrate is counterbalanced by the deflection of the lid, thereby rendering an overall deflection of about −0.02 mm with lid 24 and a deflection of about −0.03 mm with lid 112.

It should be understood, however, that for some applications, a lid having a configuration of the lid 212 (and/or further modified surface areas of corner areas, or size of the gaps) may be more appropriate. For example, if the deflection of the packaging substrate was about 0.2 mm due to its material properties, the lid 212 would counterbalance such deflection and provide negligible overall deflection of the package. The overall deflection of a lid is dependent in part on the residual stresses imposed on the lid during heating and cooling, and/or those stresses of the material forming the lid.

Thus, according to an example embodiment of a method of modifying a lid for an integrated circuit package (e.g. a BGA package), the deflection of the packaging substrate may be determined, and the deflection of the lid may be determined. Depending on the deflection of the package components separately, an appropriate lid configuration may be selected (e.g. lid 24, lid 112, or lid 212). Generally, if the deformation of the lid itself is greater than the warpage of the packaging substrate, then the lid is adversely contributing to the overall deformation of the package and removal of portions or all of the corner areas is appropriate. Alternatively, modification of the surface area or footprint of the corner areas may be appropriate and/or modification of the size of the gaps of the corner areas may be appropriate.

Thus, by modifying the configuration of the corner areas and/or side portions, the resulting surface area of the corner areas and/or side portions may be adjusted. As such, the area or foot print of the corner areas and/or side portions that is adherable or coupleable to the upper surface of the packaging substrate may be adjusted. Optimization of coplanarity of the package, and reduction in deformation, may be achieved without the need to increase lid thickness around its perimeter and/or increase underfill and other adhesive materials needed. As such, the overall cost is reduced while the ease of manufacture is enhanced.

Accordingly, an example method of assembling an integrated circuit package includes the step of providing a lid for attaching to a semiconductor die packaging substrate, the lid having opposing side portions and corner areas. A portion of each of the corner areas is removed, thereby forming a gap in each of the corner areas. The side portions of the lid are attached to the packaging substrate so that the gap in each of the corner areas exposes a correspondingly aligned portion of the packaging substrate. The lid may include a central area lying on a first plane, whereby corner areas are depressed so that the corner areas lie on a second plane spaced from the first plane. An arcuate wall is thereby formed, which is disposed between and interconnecting the central area and a corresponding one of the corner areas.

It is to be understood that terms such as "left", "right", "front", "rear", "side", "end", "width", "inner", "outer" and the like as may be used herein, merely describe points or portions of reference and do not limit the present invention to any particular orientation or configuration. Further, terms such as "first", "second", "third", etc., merely identify one of a number of portions or components as disclosed herein, and do not limit the present invention to any particular configuration.

Although the apparatus and method are illustrated and described herein as embodied in one or more specific examples, it is nevertheless not intended to be limited to the details shown, since various modifications and structural changes may be made therein without departing from the scope of the apparatus and method and within the scope and range of equivalents of the claims. Accordingly, it is appropriate that the appended claims be construed broadly and in a manner consistent with the scope of the apparatus and method, as set forth in the following claims.

What is claimed is:

1. An apparatus comprising:
   a packaging substrate including an upper side and an opposing underside;
   an integrated circuit coupled to the upper side of the packaging substrate;
   an array of contacts coupled to the underside of the packaging substrate for electrically coupling the integrated circuit to a circuit board; and
   a lid including:
      at least first and second side portions coupled to the upper side of the packaging substrate, the first side portion is spaced apart from the second side portion by a first arcuate edge to define a first gap having a first arcuate inner boundary and exposing a correspondingly first aligned portion of the packaging substrate;
      a central portion; and
      a wall portion having a substantially circular configuration and disposed between and interconnecting the central portion and the first and second side portions, such that a first arcuate portion of the wall portion interfaces with the first arcuate edge between the first and second side portions, wherein an upper side of the integrated circuit is in contact with the lid central portion.

2. The apparatus of claim 1, wherein the first arcuate portion of the wall portion is angled between 30° and 45° related to the central portion.

3. The apparatus of claim 1, wherein the lid has a substantially uniform caliper.

4. The apparatus of claim 1, wherein an upper side of the first and second side portion lies on a second plane, an underside of the first and second side portions lies on a second plane, the opposing underside of the packaging substrate lies on a third plane, and wherein the third plane is spaced from the first plane farther than the third plane is spaced from the second plane.

5. The apparatus of claim 1, wherein the array of contacts is a ball grid array.

6. The apparatus of claim 1, wherein the first and second side portions are coupled to the packaging substrate.

7. The apparatus of claim 1, the lid further comprising:
   third and fourth side portions coupled to the upper side of the packaging substrate,
   wherein the second side portion is spaced apart from the third side portion by a second arcuate edge to define a second gap having a second arcuate inner boundary and exposing a correspondingly second aligned portion of the packaging substrate,
   wherein the third side portion is spaced apart from the fourth side portion by a third arcuate edge to define a third gap having a third arcuate inner boundary and exposing a correspondingly third aligned portion of the packaging substrate, and
   wherein the fourth side portion is spaced apart from the first side portion by a fourth arcuate edge to define a fourth gap having a fourth arcuate inner boundary and exposing a correspondingly fourth aligned portion of the packaging substrate.

8. The apparatus of claim 7, wherein the second, third and fourth arcuate portion of the wall portion are each angled between 30° and 45° relative to the central portion.

9. An apparatus comprising:
   a packaging substrate including an upper side and an opposing underside;
   an integrated circuit coupled to the upper side of the packaging substrate;
   an array of contacts coupled to the underside of the packaging substrate for electrically coupling the integrated circuit to a circuit board;
   a lid including:
      opposing first, second, third and fourth side portions in which the first and third side portions oppose each other and in which the second and third side portions oppose each other, the first, second, third and fourth side portions coupled to the upper side of the packaging substrate, the first side portion is spaced apart from the second side portion by a first arcuate edge to define a first gap having an arcuate inner boundary and exposing a correspondingly first aligned portion of the packaging substrate, the second side portion is spaced apart from the third side portion by a second arcuate to define a second gap having an arcuate inner boundary and exposing a correspondingly second aligned portion of the packaging substrate, the third side portion is spaced apart from the fourth side portion by a third arcuate edge to define a third gap having an arcuate inner boundary exposing a correspondingly third aligned portion of the packaging substrate, and the fourth side portion is spaced apart from the first side portion by a fourth arcuate edge to define a fourth gap having an arcuate inner boundary and exposing a correspondingly fourth aligned portion of the packaging substrate;
      a central portion; and
      a wall portion having a substantially circular configuration in plan view and disposed between and interconnecting the central portion and the first, second, third and fourth side portions, such that spaced apart arcuate portions of the wall portion interface respectively with the first, second, third, and fourth arcuate edges, wherein an upper side of the integrated circuit is in contact with the lid central portion.

10. The apparatus of claim 9, wherein the lid central portion has an underside lying on a first plane, the first, second, third and fourth side portions having respective undersides lying on a second plane spaced from the first plane, and wherein the underside of the central portion is in contact with the upper side of the integrated circuit.

11. The apparatus of claim 10, wherein the wall portion is disposed at an angle between 30° and 45° related to the central portion.

12. The apparatus of claim 9, wherein the lid has a substantially uniform caliper.

13. The apparatus of claim 9, wherein the array of contacts is a ball grid array.

14. The apparatus of claim 9, wherein the integrated circuit is spaced from upper sides of the first, second, third and fourth side portions.

\* \* \* \* \*